(12) United States Patent
Li (10) Patent No.: US 8,378,282 B2
(45) Date of Patent: Feb. 19, 2013

(54) DEVICE FOR INCREASING THE LUMINOUS FLUX PER UNIT AREA WITH THE ABILITY TO REDUCE THE LIGHT-TAKING DISTANCE IN RESPECT TO THE OPPOSITE LIGHT SOURCE

(75) Inventor: Hiu Yeung Li, Zhuhai (CN)

(73) Assignee: New Concept Aircraft (Zhuhai) Co., Ltd., Wanzai, Zhuhai (CN)

( * ) Notice: Subject to any disclaimer, the term of this patent is extended or adjusted under 35 U.S.C. 154(b) by 652 days.

(21) Appl. No.: 12/637,431

(22) Filed: Dec. 14, 2009

(65) Prior Publication Data

US 2010/0206358 A1    Aug. 19, 2010

(30) Foreign Application Priority Data

Feb. 13, 2009   (CN) .......................... 2009 1 0037190
Mar. 25, 2009   (CN) .......................... 2009 1 0127987

(51) Int. Cl.
*G01C 21/02*     (2006.01)
*H01L 31/042*    (2006.01)

(52) U.S. Cl. ..................................... 250/203.4; 136/246

(58) Field of Classification Search ............... 250/203.4; 136/246, 259

See application file for complete search history.

(56) References Cited

U.S. PATENT DOCUMENTS

2005/0242271 A1* 11/2005 Weng et al. ................ 250/214.1
2008/0185034 A1*  8/2008 Corio ........................... 136/246

* cited by examiner

*Primary Examiner* — Thanh Luu
(74) *Attorney, Agent, or Firm* — Allen, Dyer, Doppelt, Milbrath & Gilchrist, P.A.

(57) ABSTRACT

A device for increasing the luminous flux per unit area with the ability to reduce the light-taking distance in respect to the opposite light source of the present invention mainly comprises a front lens part, a rear lens part, an axial mutually-perpendicular bi-axial support, a movable support, a fixed base, dampers for automatically limiting tilt speed, tilt gravity generators and photoelectric conversion array, etc. Based on the principle of light group field effect, the device can increase the luminous flux and light intensity per unit area of excident light by use of lens array group so that the photoelectric conversion system is able to get more light energy. The device is able to automatically keep pace with the motion of the sun in two dimensions without measuring sensors. The device is mainly applied in solar energy photovoltaic generating technology and recycling of different light energies.

8 Claims, 11 Drawing Sheets

DEVICE FOR INCREASING THE LUMINOUS FLUX PER UNIT AREA WITH THE ABILITY TO REDUCE THE LIGHT-TAKING DISTANCE IN RESPECT TO THE OPPOSITE LIGHT SOURCE

CROSS-REFERENCE TO RELATED APPLICATIONS

The present invention claims priority from Chinese Patent Application Ser. No. 200910037190.3 filed Feb. 13, 2009, and Chinese Patent Application Ser. No. 200910127987.2 filed Mar. 25, 2009, which are incorporated herein by reference for all purposes.

FIELD OF THE INVENTION

The present invention relates to a device mainly applied in solar energy photovoltaic generating technology and recycling of different light energies, more particularly, to a device for increasing the luminous flux per unit area with the ability to reduce the light-taking distance in respect to the opposite light source based on the light group field effect, which can effectively reduce the light-taking distance in respect to the opposite light source so as to increase the luminous flux and light intensity per unit area at the light receiving location and the efficiency of collecting solar energy in the period of effective illumination time can be increased.

BACKGROUND OF THE INVENTION

Solar energy is a major lasting energy to human beings which is pollution free and clean, nowadays solar energy photovoltaic generating technology is one of the basic ways by which human beings get energy from the sun. The main criteria for evaluating advantage and disadvantage of a certain technical scheme of solar energy photovoltaic generating technology depends on the efficiency of the technical scheme in collecting solar energy per unit area on the earth. The efficiency of collecting solar energy per unit area on the earth specifically refers to that: the luminous flux value and light intensity value of sun light collected in unit time from a unit steradian at a certain location on the earth. For solar energy photovoltaic generating technology, the larger the luminous flux and light intensity of sun light with relative stable spectral frequency, the more advantages for photoelectric conversion system (such as solar cells) to generate increased quantity of optic-to-electric, and more electric energy can be obtained per unit area on the earth. This is due to the reason that: if the projection light projected on the photoelectric conversion system occurs photoelectric effect with its spectral frequency (or amplitude) being relative stable, the saturation value of the optic-to-electric strength generated will be in direct proportion to the luminous flux and light intensity of the projection light per unit area.

At present, the prior technical schemes of focusing solar energy by optical method are mainly schemes of light focused by the convex lens and light focused by the Fresnel lens, and other schemes utilizing different kinds of plane mirrors or parabolic reflectors, etc.

According to the prior schemes of light focused by the convex lens and light focused by the Fresnel lens, by using the light refraction characteristic of condensing lens, the sun light through lens area is refracted and focused to form a high temperature focal spot with high luminance nearby the lens focus. The area of condensing lens is much larger than that of the focal spot after light being focused, therefore, the solar energy collected per unit area can not be increased substantially by this kind of scheme; only the light intensity of focal spot is increased by the sun light through the lens area being refracted and focused. Although the used amount of solar cell can be reduced by this method, the focal spot formed after the sun light being refracted and focused by the condensing lens is in high temperature, with the photoelectric conversion efficiency of solar cell being inversely proportional to the temperature, cooling part is a must so that this kind of condenser-lens solar cells is able to maintain work efficiency and avoid being burnt, wherein the cooling part consumes certain amount of power, therefore, the efficiency-cost-ratio and cost performance of this kind of scheme are relatively low. Furthermore, the precondition of this kind of scheme is "light focusing", the focal spot formed and the light intensity of the focal spot should be ensured, however, it is unable to adjust the distance between lens and collecting panel of solar cell to avoid happening of over-temperature.

For the prior schemes utilizing different kinds of plane mirrors or parabolic reflectors, the volume of light focusing system needs to occupy relatively large land area and space volume. Moreover, sun lights from different angles reached at different reflecting planes are reflected and focused together at a certain light focusing spot according to this scheme, which increases the sun light intensity of the spot, however, the total area of the reflecting planes in light-taking is far larger than the area of the light focusing spot. In conclusion, this kind of method can not substantially produce the effect of increasing the efficiency of collecting solar energy per unit area on the earth and the efficiency-cost-ratio and cost performance are relatively low.

Due to earth rotation and revolution around the sun, azimuth and declination angle change along with the daily movement of the sun in respect to a certain location on the earth. It is a must to have the light-taking plane of solar cell move all the time to track the sun so that more solar energy can be collected per unit time in the period of effective illumination time every day. Different kinds of sun-tracking methods of prior art mainly utilize measuring sensors (such as photosensitive sensor, heat sensitive sensor and temperature difference sensor, etc.) to induce sun light, then the measuring information is analyzed and processed by related devices, instructions are sent to servomechanism so that the mechanism moves accordingly to track the sun. The mechanism by this kind of method is complex in structure which consumes a certain amount of energy. Furthermore, devices by this kind of method are apparently limited by weather conditions (such as dark days with the sun can not be seen or the days when the sun covered by too many clouds), thereby mal-operations are likely to occur due to the low reliability and validity of the system. In addition, of the prior means of sun-tracking, there are devices utilizing computer compilation to preset programme so as to instruct the servomechanism to track the sun movement. The mechanism by this kind of method is also complex in structure which consumes a certain amount of energy, therefore, the efficiency-cost-ratio and cost performance are relatively low.

Obviously, in order to further develop solar energy photovoltaic generating technology for human beings, it is a must to change the light taking and focusing scheme of solar energy fundamentally by utilizing a more effective new way to increase the efficiency of collecting solar energy per unit area on the earth, and a concise and reliable new method is also needed to track the motion of the sun in two dimensions. The device product manufactured by the new technical scheme should have high efficiency-cost-ratio and cost performance so as to be widespread.

At present, human society consumes daily electric energy mostly on illumination (such as public facility illumination of street, park, public square and shop, etc, underground traffic illumination, illumination of residential area, corridor and family, etc.). Under the precondition that illumination effect and environment appearance are not affected, recycling the energy of different lamp lights by easy and effective means of light-taking and energy-collecting can save lots of energy with significant meanings which worth human society to pay high attention.

SUMMARY OF THE INVENTION

The present invention aims at providing a technical scheme applied in solar energy photovoltaic generating technology and recycling of different light energies based on the principle of light group field effect, that is, to provide a device for increasing the luminous flux per unit area with the ability to reduce the light-taking distance in respect to the opposite light source, which can distinctly increases luminous flux per unit area and intensity of excident light.

Another aim of the present invention is to provide a device for increasing the luminous flux per unit area with the ability to reduce the light-taking distance in respect to the opposite light source, which can track sun light automatically, that is, enabling the tracking function on motion of the sun in two dimensions; the device is not equipped with any measuring sensors and consumes no energy in movement.

The goal of the present invention is achieved by the following technical scheme:

A device for increasing the luminous flux per unit area with the ability to reduce the light-taking distance in respect to the opposite light source comprises a support, a front lens part and a rear lens part, the front lens part and the rear lens part are disposed in order towards the incident light, and connected with each other by the support to form a main body of the device; a principal optic axis of the front lens part, a principal optic axis of the rear lens part and a central axis of light receiving surface of a light receiving part coincide with each other; characterized in that: incident light projected on light receiving surface of the front lens part is focused for the first time by the front lens part to form excident light, and the excident light from the front lens part is focused for the second time by the rear lens part then projected to the light receiving surface of the light receiving part, area A1 of the light receiving surface of the front lens part is substantially equal to area A3 of the light receiving surface of the light receiving part, the excident light after being focused for the second time by the rear lens part is projected on the plane where the light receiving surface of the light receiving part is located, having a section area A2 which is substantially equal to the area A3 of the light receiving surface, the difference between the areas A2 and A1 is less than or equal to 10% A1 and the difference between the areas A3 and A1 is less than or equal to 10% A1.

Wherein said light receiving part comprises a photoelectric conversion part which is disposed after the rear lens part; the front lens part, rear lens part and photoelectric conversion part are connected with each other by the support to form the main body of the device; the excident light from the front lens part is focused for the second time by the rear lens part and then projected to the light receiving surface of the photoelectric conversion part.

Wherein said light receiving part can be a kind of a rechargeable part directly utilizing light energy to charge, such as a rechargeable lamp utilizing light energy to charge, a mobile phone charger utilizing light energy to charge and a storage battery utilizing light energy to charge, etc.

Wherein said device for increasing the luminous flux per unit area further comprises a sun-tracking part for making said main body of the device rotate with respect to the horizontal plane according to the direction of incident sun light so that the light receiving surface of said front lens part is perpendicular to the incident sun light.

By employing the above-mentioned technical schemes, the present invention has the following advantages and effects:

1. The light-taking angle in respect to the center point of the opposite light source is enlarged by the lens array group of the present invention and at the same time the range of light-taking field in respect to the center point of the opposite light source is narrowed, accordingly, the luminous flux per unit area of the excident light of the lens array group is increased and the light intensity per unit area of the excident light of the lens array group is increased as well, the efficiency of collecting light energy per unit area is distinctly increased so that the corresponding photoelectric conversion system (such as solar cells) is able to converse more optic-to-electric energy. Under the existing material condition, the engineering experiment results indicate that: the luminous flux and light intensity per unit area of the natural light (such as sun light in summer) on the earth can be increased from 40% to 80% by the present invention; and within a certain distance the luminous flux and light intensity per unit area of the indoor and outdoor lamp light (such as common houselights) can be increased from 60% to 250%.

2. According to the present invention, the sum of size of the incident light spot of lens array group is substantially equal to the area of front lens array, the light intensity of the light spot area is distinctly increased but the temperature changes less than or equal to ±5%. Therefore, the present invention will not damage the photoelectric conversion system (such as solar cells) due to high temperature, and there is no need to equip solar cells with cooling or temperature-holding part, thereby the structure is simple and saves energy distinctly.

3. By utilizing principles of gravity and centrifugal tilt speeding limiting damp, the present invention is able to track the changes of sun azimuth and declination angle in given period of time so as to keep pace with the motion of the sun in two dimensions, accordingly, solar energy can be collected to the utmost extent in the period of effective illumination time every day. There is no need to equip the sun two dimensional tracking part with measuring sensor which consumes no energy, thereby the structure is simple and saves energy distinctly.

4. The area occupied by the present invention is the area occupied by the photoelectric conversion system (such as solar cells), therefore, when applying the present invention to the limited land and space resources of city or outskirts of a city, the present invention has distinct advantage in saving land and space resources.

5. The design of the movable chutes of the photoelectric conversion array of the present invention is able to make the photoelectric conversion array (such as solar cells) disengage from lens array in the environment of dark days with low illumination or cloudy days so as to collect diffused light, reflected light and scattered light, etc of the sun to carry out photoelectric conversion, thereby the application scope and utilization rate of the present are enlarged.

6. The present invention can be made of common glass or optical glass, engineering plastics or common metal materials by common industrial techniques, the efficiency-cost-ratio and cost performance are good so that the present invention can be easily and widely used. The total structure of the present invention is simple and reliable with relatively low weight, components are not very likely to be damaged or worn out, it is easy to use, maintain and repair the present invention. The side ventilated structure with low center of gravity according to the present invention is able to resist the attacks from bad weather environment (such as typhoon, storm or sand flying up in the air) and suitable to be used for a long time in different territorial environments.

7. After the lens array of the present invention being integrated and microminiaturize by process technology, it can be used directly in solar cell packaging so that the weight is further reduced and application scope is enlarged, such as applications in recycling energy from different illumination lamp lights, applications in aerospace craft, space station, ground station of moon or Mars, etc.

BRIEF DESCRIPTION OF THE DRAWINGS

Further characteristics and advantages of the present invention will become apparent from the following description of the preferred embodiments of the present invention, with references to the attached drawings, which are intended for explanation purposes and not limitative with respect to shapes or dimensions, in which:

FIG. 3a is a decomposed schematic view of lens arrays of the device for increasing the luminous flux per unit area according to the first embodiment of the present invention;

FIG. 3b is an assembling structural view of the lens arrays as shown in FIG. 3a;

FIG. 5b is a front view of the horizontal damper for limiting tilt speed as shown in FIG. 5a;

FIG. 5c is a schematic view illustrating the principle of moveably overspeed-preventing by the centrifuge rotor and the conical overspeed-preventer cover of the horizontal damper for limiting tilt speed as shown in FIG. 5a;

FIG. 10a is a decomposed schematic view of lens arrays of the device for increasing the luminous flux per unit area according to the second embodiment of the present invention;

FIG. 10b is an assembling structural view of the lens arrays as shown in FIG. 10a;

FIG. 11a is a decomposed schematic view of lens arrays of the device for increasing the luminous flux per unit area according to the third embodiment of the present invention;

FIG. 11b is a schematic view showing the light path of the lens arrays as shown in FIG. 11a;

DETAILED DESCRIPTION OF THE PREFERRED EMBODIMENTS

First Embodiment

Figure 1:
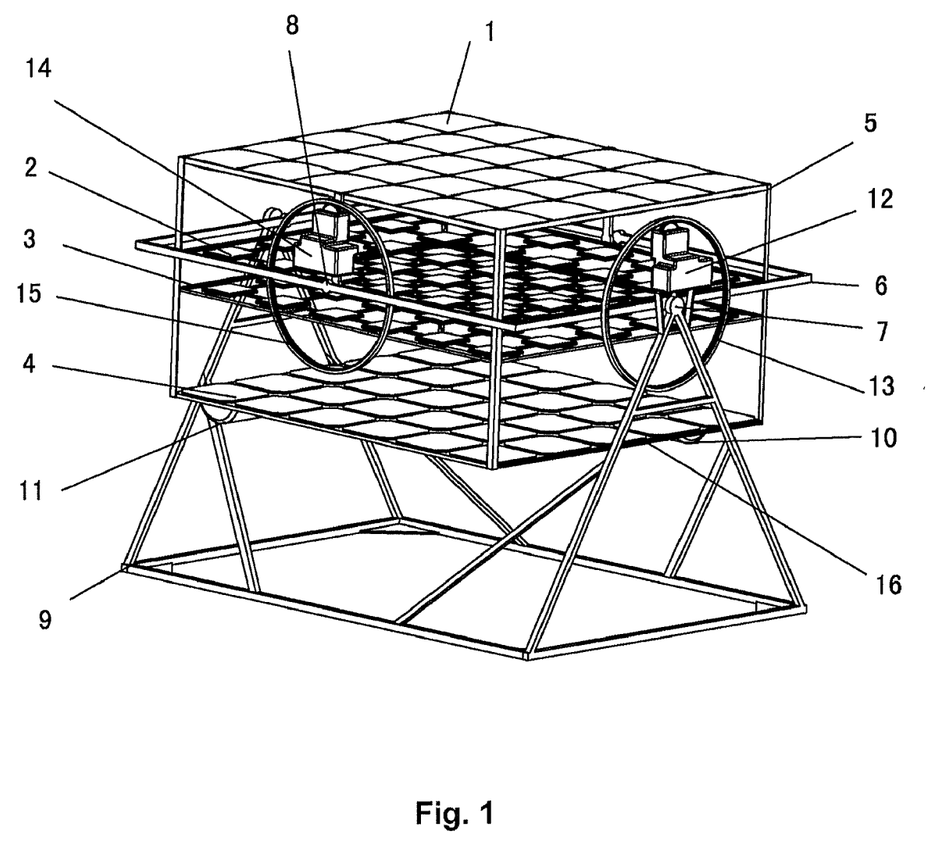
FIG. 1 is a general assembly view of a device for increasing the luminous flux per unit area with the ability to reduce the light-taking distance in respect to the opposite light source according to the first embodiment of the present invention.
Figure 2:
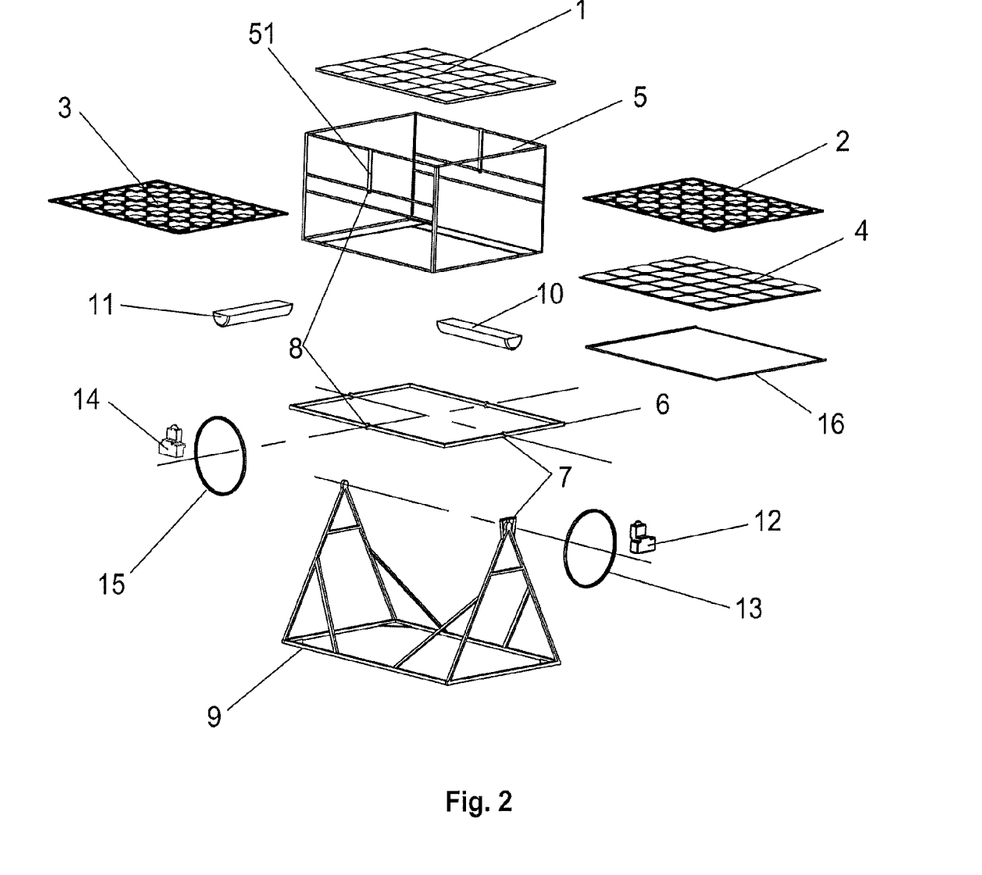
FIG. 2 is an exploded view of the device for increasing the luminous flux per unit area as shown in FIG. 1.

As illustrated in FIGS. 1 and 2, a device for increasing the luminous flux per unit area with the ability to reduce the light-taking distance in respect to the opposite light source of the present invention comprises a front lens part, a rear lens part and a photoelectric conversion part which are disposed in order towards a light source, wherein the front lens part, rear lens part and photoelectric conversion part are connected integrally by a movable support 5.

Figures 3A, 3B:
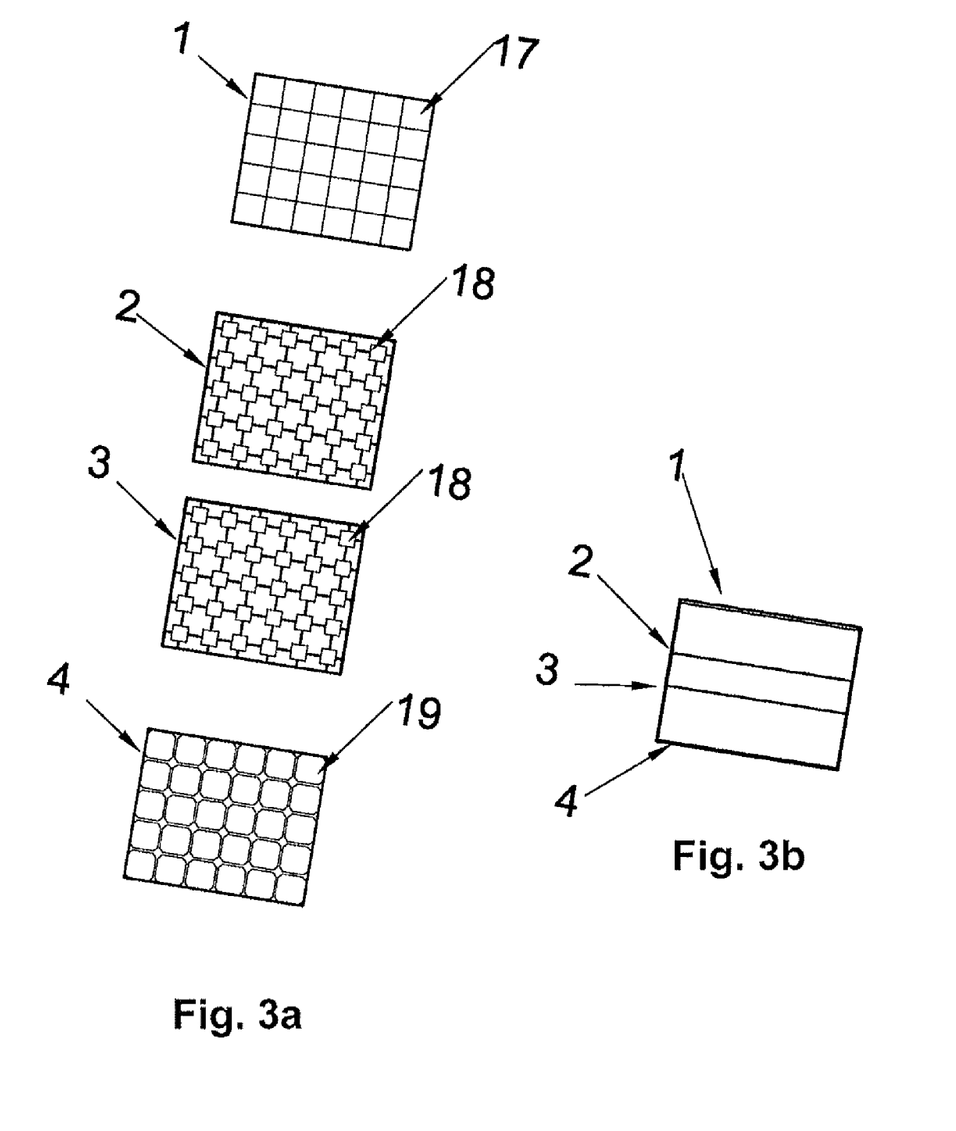

As illustrated in FIGS. 3a and 3b, the front lens part comprises a front lens array 1 made up of one or more convex lenses 17 which are arranged transversely; the rear lens part comprises one or more arrays, each array is made up of one or more convex lenses or concave lenses 18 which are arranged transversely; the photoelectric conversion part comprises an array 4 made up of one or more photoelectric conversion elements 19 which are arranged transversely. In this embodiment of the present invention, the rear lens part comprises a first rear lens array 2 and a second rear lens array 3, which are disposed in order towards the light source. Of said front lens array 1, first rear lens array 2 and second rear lens array 3, a plurality of transversely arranged lenses are fixedly connected with each other by a connecting part to form a plate like structure in shape of rectangle (or polygon, ellipse, round or other geometry). Of said photoelectric conversion array 4, a plurality of transversely arranged solar cells are fixedly connected with each other by a connecting part to form a plate like structure in shape of rectangle (or polygon, ellipse, round or other geometry).

The central axis of a convex lens 17 of the front lens array 1 is on the same line with the central axis of the corresponding convex lens or concave lens 18 of the rear lens array, forming a luminous flux increasing tandem unit 20 which can enlarge the light-taking angle in respect to the center point of the opposite light source and narrow the range of light-taking field in respect to the center point of the opposite light source so as to shorten the distance from the light source when collecting light and focusing energy therefrom, the luminous flux and light intensity per unit area of the excident light from the rear lens part can be enlarged by the luminous flux increasing tandem unit 20, the excident light from the luminous flux increasing tandem unit 20 is projected to the light receiving portion of the photoelectric conversion part.

Figure 4A:
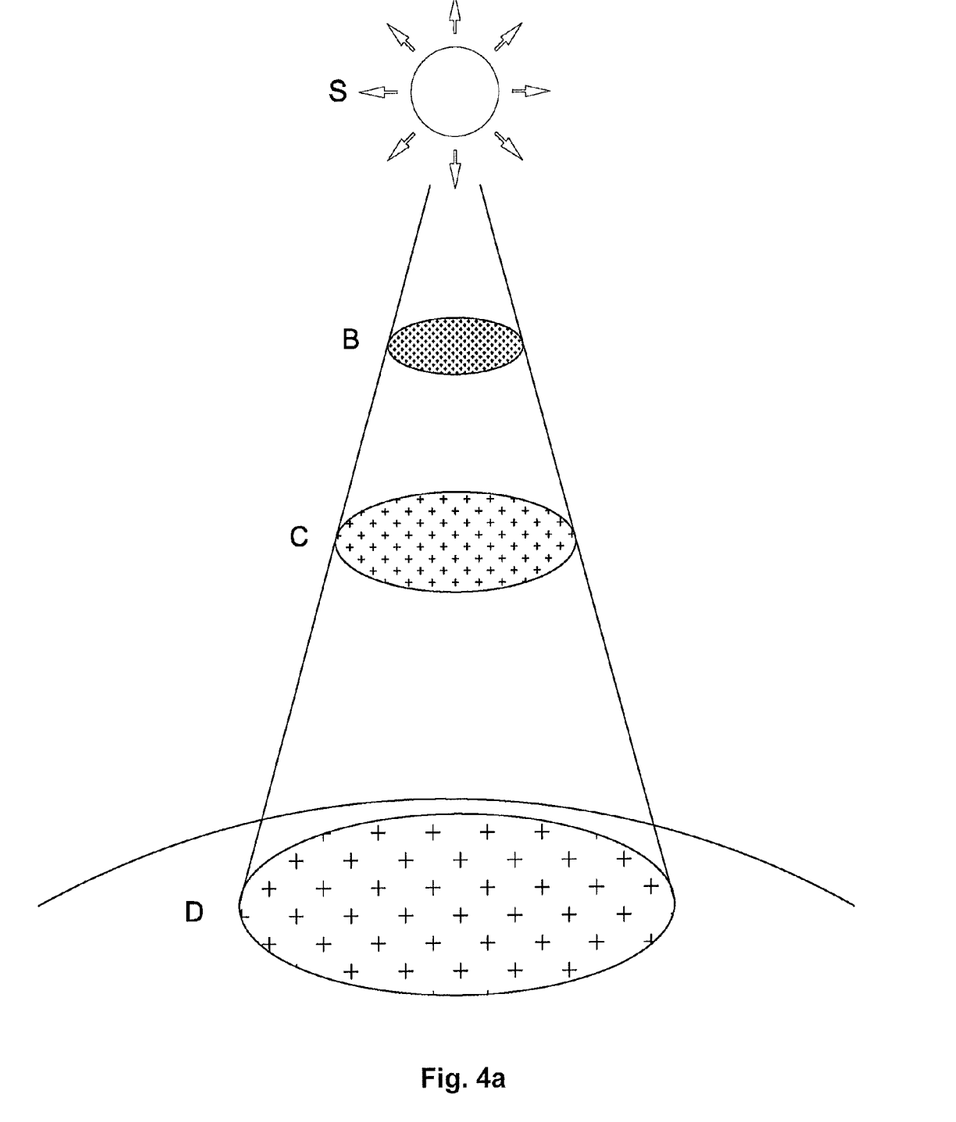
FIG. 4a is a schematic view of the light-taking field suitable for the device for increasing the luminous flux per unit area of the present invention.
Figure 4B:
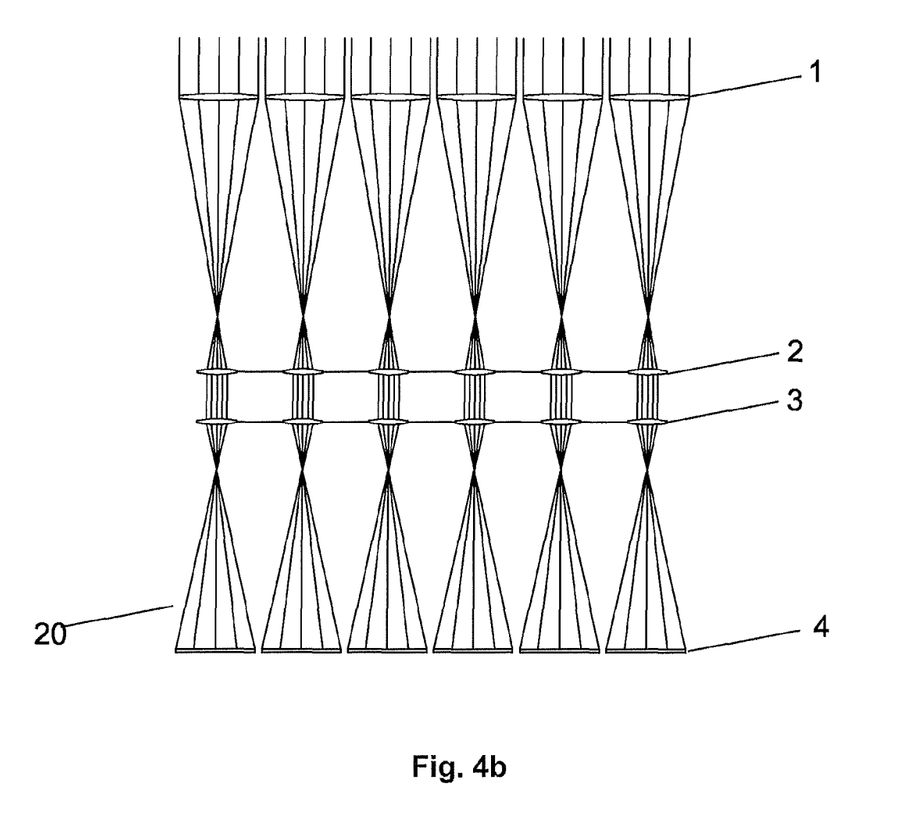
FIG. 4b is a schematic view showing the light path of the lens arrays of the device for increasing the luminous flux per unit area according to the first embodiment of the present invention.
Figure 4C:
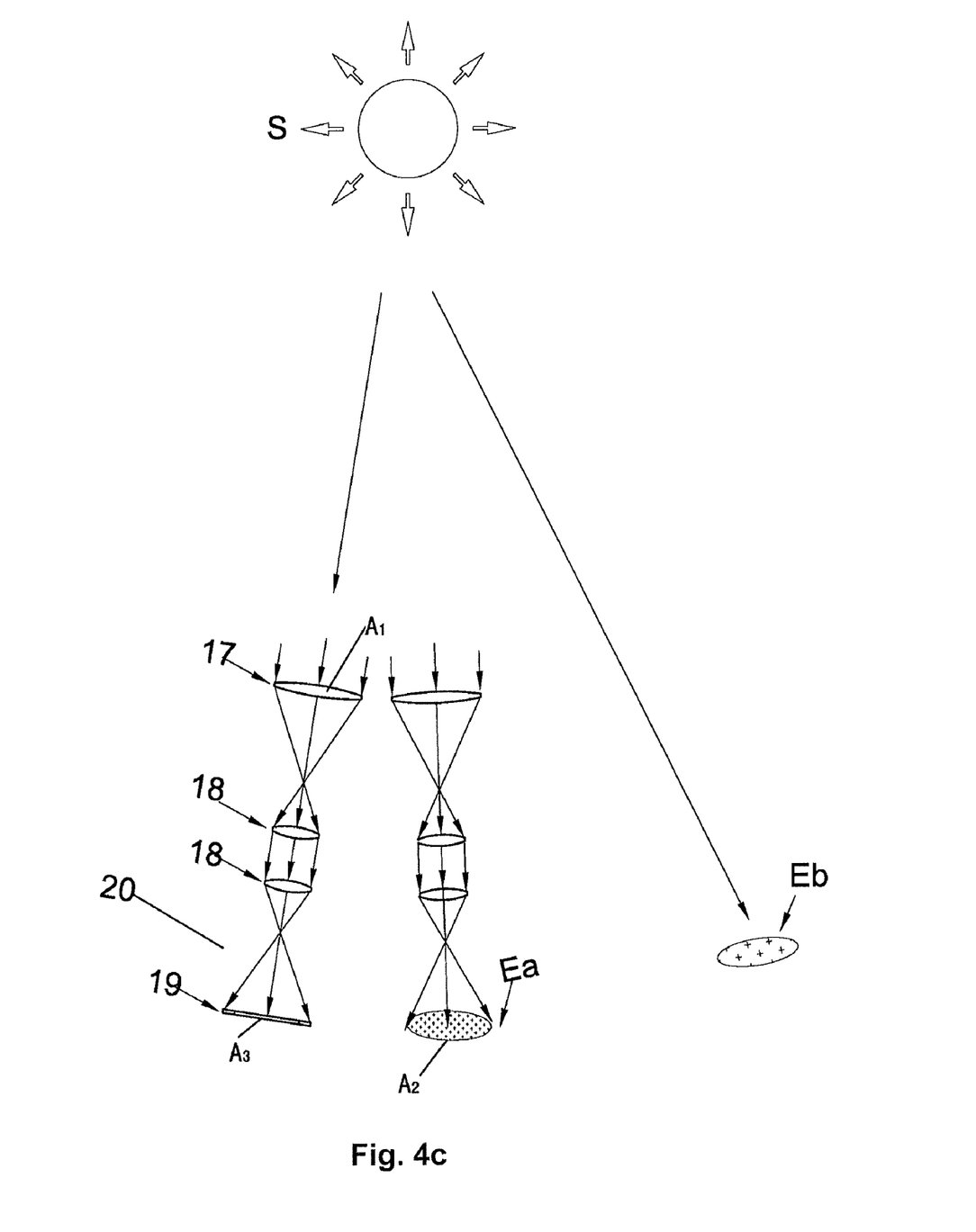
FIG. 4c is a schematic view showing the light path and effect of increasing luminous flux of a single tandem unit of the lens arrays as shown in FIG. 4b.
Figure 5A:
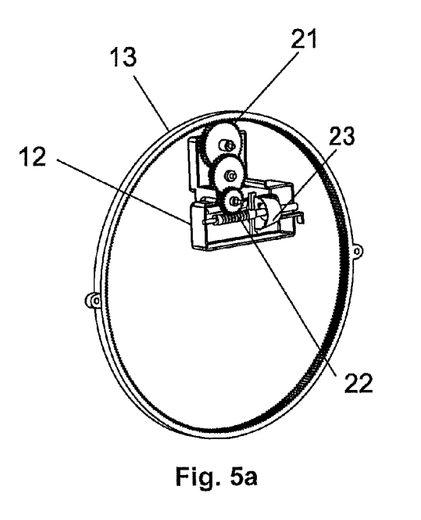
FIG. 5a is a perspective structural view of a horizontal damper for limiting tilt speed of the device for increasing the luminous flux per unit area according to the first embodiment of the present invention.
Figure 5B:
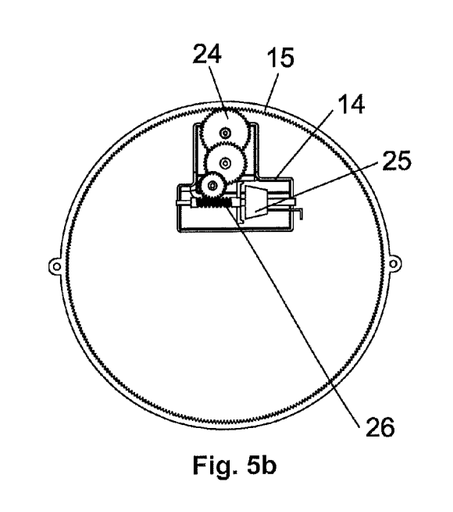
Figure 5C:
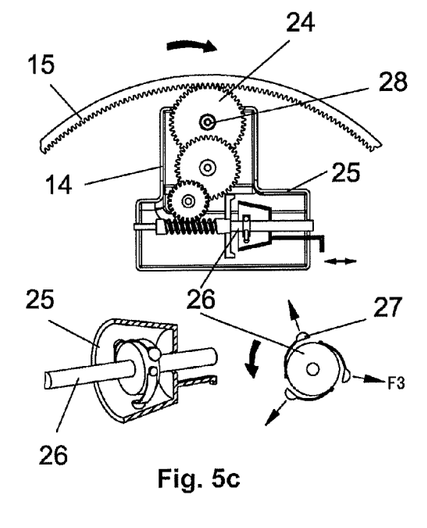
Figure 5D:
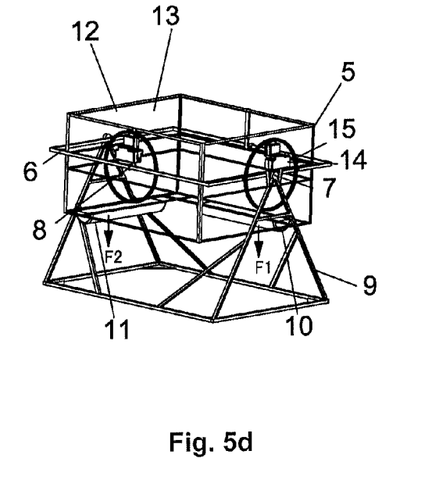
FIG. 5d is an assembling structural view showing the three-dimensional appearance of the dampers for limiting tilt speed of the device for increasing the luminous flux per unit area of the present invention.

As illustrated in FIGS. 4b and 4c, the front lens part 1, first rear lens array 2, second rear lens array 3 and photoelectric conversion array 4 are disposed at an interval of a certain distance, so that the area A1 of the light receiving surface of the front lens part is substantially equal to the area A3 of the light receiving surface of the photoelectric conversion part; the excident light after being focused for the second time by the rear lens part is projected on the plane where the light receiving surface of the photoelectric conversion part is located, having a section area A2 which is substantially equal to the area A3 of the light receiving surface, the difference between the areas A2 and A1 is less than or equal to 10% A1 and the difference between the areas A3 and A1 is less than or equal to 10% A1

In this embodiment of the present invention, the back focal length of a lens of the front lens array 1 is larger than the front focal length of the corresponding lens of the first rear lens array 2; the back focal spot of the lens of the front lens array 1 and the front focal spot of the corresponding lens of the first rear lens array 2 coincide, or the distance between the back focal spot of the lens of the front lens array 1 and the front focal spot of the corresponding lens of the first rear lens array 2 is less than or equal to 10% of the back focal length of the lens of the front lens array 1.

The convex lens 17 and convex lens or concave lens 18 of the front lens array 1 are in shape of rectangle, polygon or round, the side length or diameter of the convex lens 17 is larger than or equal to the side length or diameter of the convex lens or concave lens 18 of the first rear lens array 2; the side length or diameter of the convex lens or concave lens 18 of the first rear lens array 2 is equal to or not equal to the side length or diameter of the convex lens or concave lens 19 of the second rear lens array 3; the focal length of the convex lens 17 of the front lens array 1 is larger than the focal length of the convex lens or concave lens 18 of the first rear lens array 2; the focal length of the convex lens or concave lens 19 of the second rear lens array 3 is smaller than or equal to the focal length of the convex lens or concave lens 18 of the first rear lens array 2.

The luminous flux increasing tandem unit 20 is in convex-convex-convex tandem configuration, the convex lens of the front lens array 1 is in shape of square with relatively longer side length, the lens of the rear lens array 2 is a square convex lens with relatively shorter side length, the lens of the rear lens array 3 is in shape of square with side length equal to the side length of the lens of the rear lens array 2. Wherein the back focal length of the front lens 1 is four times as much as the front focal length of the rear lens 2; the distance between the optical center of the front lens 1 and the optical center of the rear lens 2 is the sum of the back focal length of the front lens 1 and the front focal length of the rear lens 2; the back focal length of the rear lens 3 is less than the front focal length of the rear lens 2; the sum of area of the light spots formed by the excident light from the rear lens array 3 projected onto the light receiving surface of the photoelectric conversion array 4 is equal to the sum of area of all the lenses of the front lens array 1.

The lens of the present invention can be made of common glass, optical glass or engineering plastics, other components of the present invention can be made of common metal, engineering plastics or other materials, being manufactured by common industrial techniques.

According to the device for increasing the luminous flux per unit area of the first embodiment of the present invention, the assembly of lens arrays is able to achieve the optical effect and increased luminous flux effect by shortening the light-taking distance in respect to the opposite light source to a quarter of the actual distance. For example, when light source S is in the form of direct sun light and the solar illumination Eb per unit area at a certain location on the earth is about 112980Lux, the solar illumination at the same location and of the same area as in the case of Eb can be increased to about 165700Lux (light spot of solar illumination Ea) by the device according to the first embodiment of the present invention. Therefore, the device accordingly to the first embodiment of the present invention is able to increase the luminous flux per unit area by about 46.7%, that is, the luminous flux per unit area of the light receiving surface of the photoelectric conversion array 4 is increased by about 46.7%, so that the photoelectric energy generated by the photoelectric conversion array 4 can be increased significantly (the increased amount of photoelectric energy is affected by the conversion efficiency of the photoelectric conversion array 4 employed in practice). In addition, while increasing the luminous flux per unit area to about 46.7% by the device according to the first embodiment of the present invention, the temperature of the light spot of Ea projected on the light receiving surface of the photoelectric conversion array 4 is not distinctly different from the temperature of external surrounding environment of the light spot, therefore, the photoelectric conversion array 4 will not be subject to significant temperature changes, and cooling or constant temperature controlling are not needed. According to the first embodiment of the present invention, the font lens array 1 employs the convex lens with a relatively larger area which is good for applications in regions with relatively lower solar illumination throughout the year.

The device for increasing the luminous flux per unit area with the ability to reduce the light-taking distance in respect to the opposite light source further comprises an axial mutually-perpendicular bi-axial support 6 and a fixed base 9; the movable support 5 is in rectangle (or polygon, ellipse, round or other geometry) shaped frame configuration, the front lens array 1, rear lens arrays and photoelectric conversion array 4 are respectively disposed on top of the movable support 5, in the middle of the movable support 5 and at the bottom of the movable support 5; the front lens array 1, the first rear lens array 2 and the second rear lens array 3 are symmetrically disposed on the movable support 5 in parallel at an interval of a certain distance so as to form a lens array group; the axial mutually-perpendicular bi-axial support 6 is in rectangle (or polygon, ellipse, round or other geometry) shaped frame configuration and disposed at a half height of the movable support 5, enclosing around the movable support 5; the axial mutually-perpendicular bi-axial support 6 has two rotating shafts perpendicular with each other, that is, horizontal rotating shaft 7 and declinational rotating shaft 8, the center line of the horizontal rotating shaft 7 and the center line of the declinational rotating shaft 8 are on the same plane and perpendicular with each other; the horizontal rotating shaft 7 is connected with the top of the fixed base 9, such that the axial mutually-perpendicular bi-axial support 6 can rotate around the horizontal rotating shaft 7, the movable support 5 is connected with the declinational rotating shaft 8 by two middle connecting rods 51, such that the movable support 5 can rotate around the declinational rotating shaft 8 and can be suspended at the top of the fixed base 9.

According to the characteristics $$\rho_s = \varphi \frac{3\rho}{4\pi Y^3}$$

of the primary light group field, that is, in the light group field generated by a light source, the distribution density $\rho_s$ of the light particles subgroup at a plane or a curved plane perpendicular to the direction of light group movement is in direct proportion to the distribution density $\rho$ of light particles subgroup at light spot surface and in inverse proportion to the third power of distance Y from the plane to the light spot. In the light-taking field as illustrated in FIG. 4a, S represents the light spot, B, C and D represent respectively light-taking planes perpendicular to the light group movement being at different distance from the light spot, wherein C is in the middle between S and D. Because the distribution densities of light particles subgroups per unit area are different at B, C and D, the luminous fluxes and light intensities per unit area are different at B, C and D, with B>C>D. When the device of the present invention is disposed at D to take light from the light source, with the principal optic axis of the lens array group directly toward the center point of the light source and the focal length of the front lens 17 as 2.5 times as much as the focal length of the rear lens 18 or more than 2.5 times as much as the focal length of the rear lens 18, the lens array group will have a luminous flux and a light intensity per unit area having the same amounts as those at a distance between S and C (FIG. 4a, B) instead of having the amounts as those at D (FIG. 4a, D), that is, by employing the present invention, it is able to shorten the distance to the light source when collecting light energy, thereby the luminous flux and light intensity per unit area obtained is larger than the luminous flux and light intensity per unit area at D when light is projected naturally. The function of the second rear lens array 3 is to enlarge the projection area of the excident light from the first rear lens array 2 to be the same as the area of the front lens array 1 so as to achieve the goal of increasing the luminous flux and light intensity per unit area at D.

The present invention utilizes lens array group to increase the luminous flux and light intensity per unit area at D rather than focusing light at D by convex lens, which is different from the way of focusing and collecting energy by light focusing lens in principle. The temperature changes of the light projected from the lens array group of the present invention to the photoelectric conversion array 4 are very small, therefore, the photoelectric conversion part (such as solar cells) will not suffer from high temperature and there is no need to equip with cooling or constant temperature controlling device. No matter whether the rear lens array of the present invention adopts convex lens or concave lens, the technical effects will be the same. The present invention is still able to increase the luminous flux and light intensity per unit area without the second rear lens array 3, but the distance between the first rear lens array 2 and photoelectric conversion array 4 will be increased.

The device for increasing the luminous flux per unit area of the present invention further comprises a sun-tracking part, wherein the sun-tracking part is a kind of automatic tilt speed limiting mechanism which comprises two groups of automatic tilt speed limiting parts, each group is made up of a fluted disk, a damper for limiting tilt speed and a tilt gravity generator, the two groups of automatic tilt speed limiting parts respectively control the tilt speed of axial mutually-perpendicular bi-axial support and the tilt speed of movable support with respect to the ground; of which one tilt gravity generator makes axial mutually-perpendicular bi-axial support produce tilt moment towards the ground, the other tilt gravity generator makes movable support produce tilt moment towards the ground.

The damper for limiting tilt speed comprises a centrifuge rotor, a conical overspeed-preventer cover and a gear set, wherein the centrifuge rotor comprises an elastic clutch disk. The tilt moment produced by the tilt gravity generator is transferred to the damper for limiting tilt speed by the fluted disk so as to drive the centrifuge rotor, the speed of the centrifuge rotor is controlled by the conical overspeed-preventer cover, and the rotating speed of the clutch disk is controlled by the speed of centrifuge rotor.

As illustrated in FIGS. 1, 2, 5a, 5b, 5c and 5d, the sun-tracking part comprises a horizontal tilt gravity generator 10, a declinational tilt gravity generator 11, a horizontal damper for limiting tilt speed 12, a horizontal speed limiting fluted disk 13, a declinational damper for limiting tilt speed 14 and a declinational speed limiting fluted disk 15.

The horizontal tilt gravity generator 10 and declinational tilt gravity generator 11 are perpendicular to each other and fixed at the bottom of the movable support 5; the horizontal damper for limiting tilt speed 12 is fixed on the fixed base 9, the horizontal speed limiting fluted disk 13 is fixed at one side of the axial mutually-perpendicular bi-axial support 6. The horizontal damper for limiting tilt speed 12 comprises a driven gear 21 of main driver, a centrifuge rotor 22 and a conical overspeed-preventer cover 23, wherein the driven gear 21 of main driver of said horizontal damper for limiting tilt speed 12 engages with the horizontal speed limiting fluted disk 13. The declinational damper for limiting tilt speed 14 is fixed on the movable support 5, the declinational speed limiting fluted disk 15 is fixed at one side of the axial mutually-perpendicular bi-axial support 6. The declinational damper for limiting tilt speed 14 comprises a driven gear 24 of main driver, a centrifuge rotor 26 and a conical overspeed-preventer cover 25, wherein the driven gear 24 of main driver of said declinational damper for limiting tilt speed 14 engages with the declinational speed limiting fluted disk 15.

Figure 6:
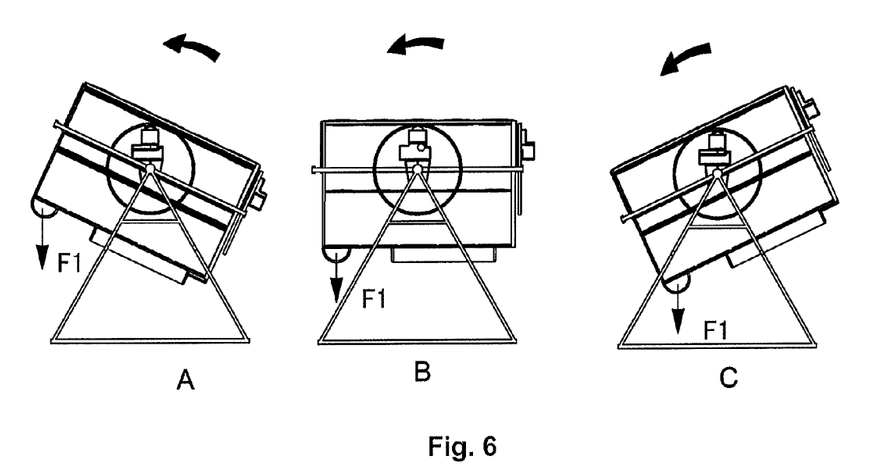
FIG. 6 is a schematic view showing the process of tracking sun movement horizontally by the device for increasing the luminous flux per unit area of the present invention.
Figure 7:
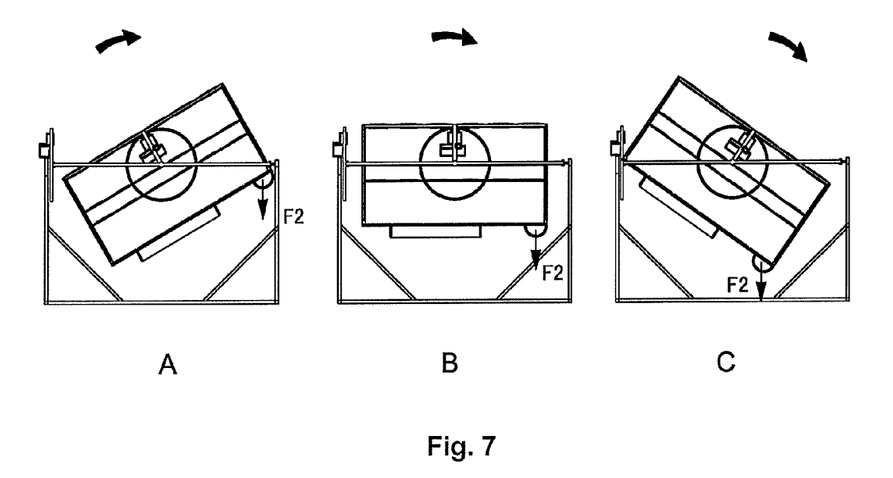
FIG. 7 is a schematic view showing the process of tracking sun movement declinationally by the device for increasing the luminous flux per unit area of the present invention.
Figure 8:
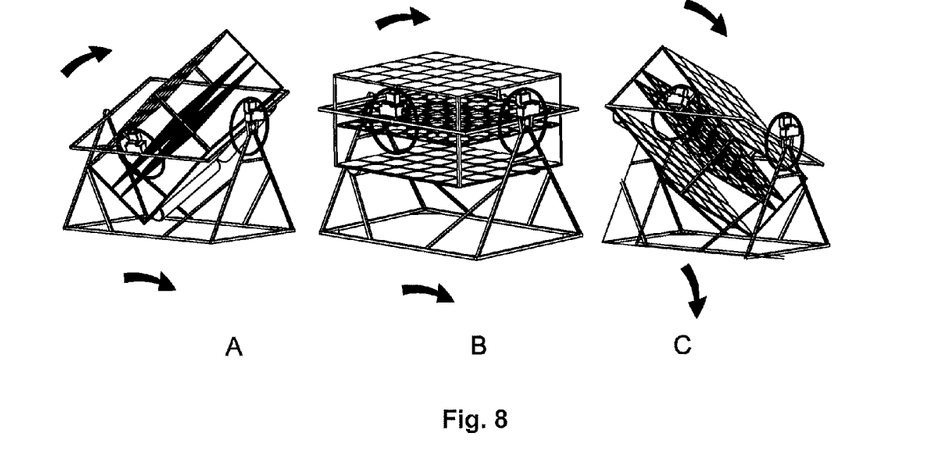
FIG. 8 is a three-dimensional schematic view showing the general effect of tracking the sun in two dimensions by the device for increasing the luminous flux per unit area of the present invention.

As illustrated in FIGS. 6, 7 and 8, of the horizontal sun-tracking part of the present invention, the fixed base 9 is connected with the axial mutually-perpendicular bi-axial support 6 by the horizontal rotating shaft 7, and the horizontal rotating shaft 7 is supported at the gravity center of the axial mutually-perpendicular bi-axial support 6. Clean water is filled inside the horizontal tilt gravity generator 10 so as to produce gravity, the horizontal tilt gravity generator 10 is fixed at the bottom of the movable support 5 to produce the tilt moment F1 with horizontal rotating shaft 7 being the axis. When driving the movable support 5 by uplifting the axial mutually-perpendicular bi-axial support 6, so as to make the principal optic axis of the lens array aim at the sun, the axial mutually-perpendicular bi-axial support 6 always tilts automatically to the side where the horizontal tilt gravity generator 10 disposed due to the down going action of the horizontal tilt gravity generator 10. Clean water (or other substance which can bring gravity) is filled inside the declinational tilt gravity generator 11 so as to produce gravity, the declinational tilt gravity generator 11 is fixed at the bottom of the movable support 5 to produce the tilt moment F2.

The horizontal damper for limiting tilt speed 14 is fixed on the fixed base 9, the declinational speed limiting fluted disk 15 is fixed at one side of the axial mutually-perpendicular bi-axial support 6, the driven gear 24 of main driver of said horizontal damper for limiting tilt speed 14 engages with the declinational speed limiting fluted disk 15, a one-way bearing 28 is disposed on the driven gear 24 of main driver so that the declinational speed limiting fluted disk 15 is able to reset by rotating reversely. When the axial mutually-perpendicular bi-axial support 6 tilts under the action of the horizontal tilt gravity generator 10, the declinational speed limiting fluted disk 15 is driven to rotate and then the driven gear 24 of main driver of said horizontal damper for limiting tilt speed 12 is driven to rotate which further drives the centrifuge rotor 26 to rotate. At the outer ring of the centrifuge rotor 26 are disposed clutch disks 27 connected by elastic reeds, when the centrifuge rotor 26 rotates, the clutch disks 27 open under the action of the centripetal force F3, the opening amount depends on the rotating speed of the centrifuge rotor 26. Outside the centrifuge rotor 26 is disposed a conical overspeed-preventer cover 25 movable along axial direction, the axis of the conical overspeed-preventer cover 25 coincides with the axis of the centrifuge rotor 26. If the rotating speed of the centrifuge rotor 26 is increased, its opening clutch disks 27 will touch the inner wall of the conical overspeed-preventer cover 25 and slow down so that the centrifuge rotor 26 can be limited at a certain rotating speed. The rotating speed of the centrifuge rotor 26 can be controlled by moving and adjusting the conical overspeed-preventer cover 25 along axial direction so as to adjust the relative distance between the inner wall of the conical overspeed-preventer cover 25 and the clutch disks 27, accordingly, the rotating speeds of the driven gear 24 of main driver and the declinational speed limiting fluted disk 15 are controlled, thereby the axial mutually-perpendicular bi-axial support 6 tilts slowly in a given speed to achieve the goal of keeping pace with the changes of the sun declination angle. The embodiments and effects of the declinational sun-tracking part of the present invention are the same as those of said horizontal sun-tracking part.

The horizontal rotating shaft 7 and declinational rotating shaft 8 of said axial mutually-perpendicular bi-axial support 6 are respectively connected with the fixed base 9 and the movable support 5 so that the present invention is able to tilt in two dimensions. When sun rises, getting the principal optic axis of the lens array to aim at the sun by tilting the axial mutually-perpendicular bi-axial support 6 and the movable support 5, and then adjusting said centrifuge rotor 26 and centrifuge rotor 22 to the preset speeds, with the combined action from the horizontal tilt gravity generator 10, the declinational tilt gravity generator 11 and dampers for limiting tilt speed, the present invention is able to track the motion of the sun in two dimensions until the preset terminated time.

Figure 9:
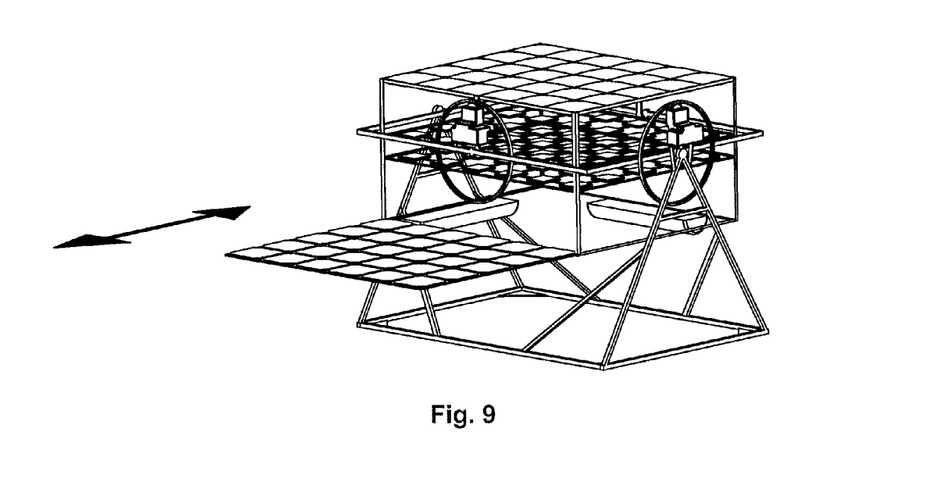
FIG. 9 is a schematic view showing the working principle of movable chutes for the photoelectric conversion array of the device for increasing the luminous flux per unit area of the present invention.

As illustrated in FIGS. 1, 2 and 9, movable chutes 16 are disposed at the bottom of said movable support, said photoelectric conversion array is connected with the movable support by said movable chutes, and said photoelectric conversion array gets into or out of the projection area of the excident light from lens array group by the movable chutes to collect light energies from diffused light, reflected light and scattered light of the sun.

Second Embodiment

Figures 10A, 10B:
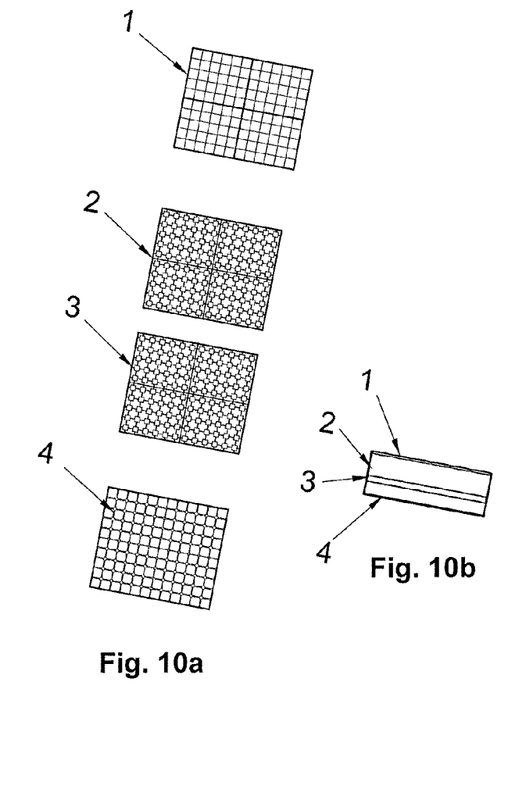
Figure 10C:
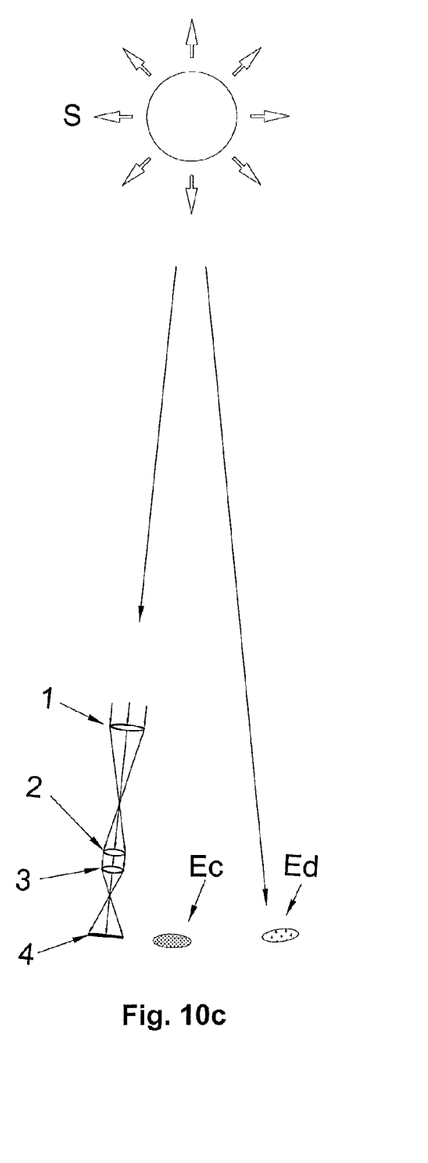
FIG. 10c is a schematic view showing the light path and effect of increasing luminous flux of a single tandem unit of lens arrays of the device for increasing the luminous flux per unit area according to the second embodiment of the present invention.

The second embodiment of the present invention is different from the first embodiment in that: as illustrated in FIGS. 10a, 10b and 10c, the luminous flux increasing tandem unit 20 is in convex-convex-convex tandem configuration, the convex lens of the front lens array 1 is in shape of square with relatively short side length, the lens of the rear lens array 2 is a square convex lens with relatively shorter side length, the lens of the rear lens array 3 is a square convex lens with the same area as that of the lens of the rear lens array 2. Wherein the back focal length of the front lens 1 is four times as much as the front focal length of the rear lens 2; the distance between the optical center of the front lens 1 and the optical center of the rear lens 2 is the sum of the back focal length of the front lens 1 and the front focal length of the rear lens 2; the back focal length of the rear lens 3 is less than the front focal length of the rear lens 2; the sum of area of the light spots formed by the excident light from the rear lens array 3 to the light receiving surface of the photoelectric conversion array 4 is equal to the sum of area of all the lenses of the front lens array 1. In the second embodiment of the present invention, the lens array group is able to achieve the optical effect and increased luminous flux effect by shortening the light-taking distance in respect to the opposite light source to a half of the practical distance. For example, when light source S is direct sun light and the solar illumination Eb per unit area at a certain location on the earth is about 95220Lux, the solar illumination at the same location and of same area as in the case of Eb can be increased to about 140960Lux (light spot of solar illumination Ec) by the device according to the second embodiment of the present invention. Therefore, the device accordingly to the second embodiment of the present invention is able to increase the luminous flux per unit area by about 48%, that is, the luminous flux per unit area of the light receiving surface of the photoelectric conversion array 4 is increased by about 48%, so that the photoelectric energy generated by the photoelectric conversion array 4 can be increased significantly (the increased amount of photoelectric energy is affected by the conversion efficiency of the photoelectric conversion array 4 employed in practice). In addition, while increasing the luminous flux per unit area to about 48% by the device according to the second embodiment of the present invention, the temperature of the light spot of Ec projected on the light receiving surface of the photoelectric conversion array 4 is not distinctly different from the temperature of external surrounding environment of the light spot, therefore, the photoelectric conversion array 4 will not be subject to significant temperature changes, cooling or constant temperature controlling are not needed. Since the area of the convex lens of the font lens array 1 is relatively small according to the second embodiment of the present invention, as compared with the first embodiment of the present invention, under the precondition that the first embodiment and the second embodiment produce almost same effects in increasing the luminous flux, the total volume of the device according to the second embodiment of the present invention is significantly smaller than the total volume of the device according to the first embodiment of the present invention. The device according to the second embodiment of the present invention is mainly suitable for applications in regions (such as desert area) with relatively strong solar illumination and frequent weather condition changes.

Third Embodiment

Figures 11A, 11B:
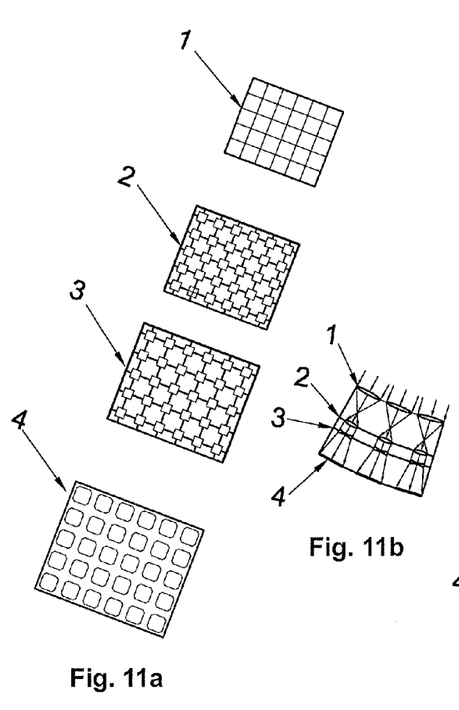
Figure 11C:
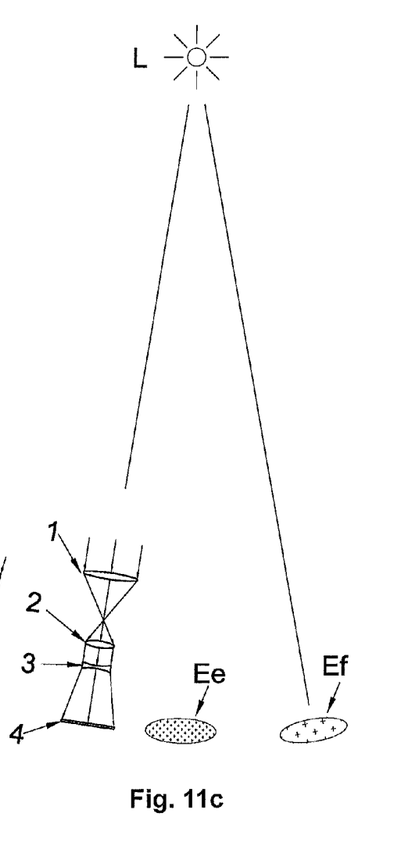
FIG. 11c is a schematic view showing the light path and effect of increasing luminous flux of a single tandem unit of lens arrays of the device for increasing the luminous flux per unit area according to the third embodiment of the present invention.

The third embodiment of the present invention is suitable to be used in recycling of different light energies. The third embodiment of the present invention is different from the first embodiment of the present invention in that: as illustrated in FIGS. 11a, 11b and 11c, the front lens array 1, the rear lens array 2 and the rear lens array 3 of the device for increasing the luminous flux per unit area of the present invention are in shape of arc respectively having a radius equal to the distance in respect to the center point of the light L. The luminous flux increasing tandem unit 20 according to the third embodiment of the present invention is in convex-convex-concave tandem configuration, the convex lens of the front lens array 1 is round convex lens with relatively larger diameter, the lens of the rear lens array 2 is round convex lens with relatively smaller diameter, the lens of the rear lens array 3 is round concave lens with relatively smaller diameter. Wherein the back focal length of the front lens 1 is four times as much as the front focal length of the rear lens 2; the distance between the optical center of the front lens 1 and the optical center of the rear lens 2 is the sum of the back focal length of the front lens 1 and the front focal length of the rear lens 2; the back focal length of the rear lens 3 is less than the front focal length of the rear lens 2; the sum of area of the light spots formed by the excident light from the rear lens array 3 to the light receiving surface of the photoelectric conversion array 4 is equal to the sum of area of all the lenses of the front lens array 1. According to the device of the third embodiment of the present invention, the lens array group is able to achieve the optical effect and increased luminous flux effect by shortening the light-taking distance in respect to the opposite light source to a quarter of the practical distance. For example, when light L is common incandescent light with power of 500 W, the illumination Ef at the location 6 meters far away from the light source is about 66Lux and there is no other light source in the light-taking environment except light L, the device according to the third embodiment of the present invention is able to increase the light illumination at the location 6 meters far away from the light source of the same area as in the case of Ef to about 140Lux (light spot of solar illumination Ee). Therefore, the device accordingly to the third embodiment of the present invention is able to increase the luminous flux per unit area by about 112.1%, that is, the luminous flux per unit area of the light receiving surface of the photoelectric conversion array 4 is increased by about 112.1%, so that the photoelectric energy generated by the photoelectric conversion array 4 can be increased significantly (the increased amount of photoelectric energy is affected by the conversion efficiency of the photoelectric conversion array 4 employed in practice). In addition, while increasing the luminous flux per unit area to about 112.1% by the device according to the third embodiment of the present invention, the temperature of the light spot of Ee projected on the light receiving surface of the photoelectric conversion array 4 is not distinctly different from the temperature of external surrounding environment of the light spot, therefore, the photoelectric conversion array 4 will not be subject to significant temperature changes, cooling or constant temperature controlling are not needed.

The increasing effect of luminous flux by the device according to the first, second and third embodiments of the present invention is affected by light transmittance of lens, isotropy and anisotropy conditions of lens material and precision of lens manufacturing, etc.

The above descriptions and illustrations should not be construed as limiting the scope of the present invention, which is defined by the appended claims. Various modifications, alternate constructions and equivalents made by technicians of the field may be employed without departing from the true spirit and scope of the present invention.

What is claimed is:

1. A device for increasing the luminous flux per unit area with the ability to reduce a light-taking distance in respect to an opposite light source comprising
   a support,
   a front lens part,
   a rear lens part, and
   a light receiving part including a photoelectric conversion part,
   wherein the front lens part, the rear lens part and the photoelectric conversion part of the light receiving part are disposed in order towards incident light, and connected with each other by the support to form a main body of the device;
   wherein a principal optic axis of the front lens part, a principal optic axis of the rear lens part and a central axis of light receiving surface of the light receiving part coincide with each other;
   wherein incident light projected on a light receiving surface of the front lens part is focused for the first time by the front lens part to form excident light, and the excident light from the front lens part is focused for the second time by the rear lens part and then projected to the light receiving surface of the photoelectric conversion part, area A1 of the light receiving surface of the front lens part is approximate to area A3 of the light receiving surface of the light receiving part, the excident light after being focused for the second time by the rear lens part is projected on the plane where the light receiving surface of the light receiving part is located, having a section area A2 which is approximate to the area A3 of the light receiving surface, the difference between the area A2 and the area A1 is less than or equal to 10% of A1, and the difference between the area A3 and the area A1 is less than or equal to 10% of A1;
   wherein said front lens part comprises at least one front lens array made up of a plurality of lenses which are arranged transversely;
   wherein the rear lens part comprises at least one rear lens array made up of a plurality of lenses which are arranged transversely;
   wherein the photoelectric conversion part comprises a photoelectric conversion array made up of a plurality of photoelectric conversion elements which are arranged transversely;
   wherein the number of lenses of each front lens array is equal to the number of lenses of each rear lens array and also equal to the number of the photoelectric conversion elements of the photoelectric conversion array;
   wherein the principal optic axis of each one of the lenses of the front lens array coincides respectively with the principal optic axis of the corresponding lens of the rear lens array and the central axis of the light receiving surface of the corresponding photoelectric conversion elements of the photoelectric conversion array, thereby each group of lenses disposed in order towards the incident light forms a luminous flux increasing tandem unit;
   wherein said rear lens array comprises a first rear lens array and a second rear lens array, the first rear lens array and the second rear lens array are disposed in order towards the incident light with their principal optic axes coinciding with each other;
   wherein the back focal length of the lens of the front lens array is larger than the corresponding front focal length of the lens of the first rear lens array; the distance between the back focal spot of the lens of the front lens array and the corresponding the front focal spot of the lens of the first rear lens array is less than or equal to 10% of the back focal length of the lens of the front lens array;
   wherein the lens of the front lens array and the lens of the first rear lens array are in a shape of a rectangle, polygon or round,
   wherein the side length or diameter of the lens is larger than or equal to the side length or diameter of the lens of the first rear lens array; and wherein the focal length of the lens of the second rear lens array is smaller than or equal to the focal length of the lens of the first rear lens array.

2. The device for increasing the luminous flux per unit area according to claim 1, wherein the back focal spot of the lens of the front lens array coincides with the front focal spot of the lens of the corresponding first rear lens array so that the excident light from the lenses of the first rear lens array are parallel lights;
  wherein the area of the lens of the first rear lens array is the same as the area of the lens of the second rear lens array, and
  wherein the back focal spot of the first rear lens array coincides with the front focal spot of the lens of the second rear lens array.

3. The device for increasing the luminous flux per unit area according to claim 2, wherein each of said front lens array, first rear lens array and second rear lens array respectively comprises convex lenses.

4. The device for increasing the luminous flux per unit area according to claim 3, wherein said support comprises a movable support, an axial mutually-perpendicular bi-axial support and a fixed base;
  wherein the front lens array, rear lens arrays and photoelectric conversion array are respectively disposed on top of the movable support, in the middle of the movable support and at the bottom of the movable support;
  wherein the axial mutually-perpendicular bi-axial support is disposed at a half height of the movable support, enclosing around the movable support;
  wherein the axial mutually-perpendicular bi-axial support has a horizontal rotating shaft and a declinational rotating shaft which are perpendicular with each other, the center line of the horizontal rotating shaft and the center line of the declinational rotating shaft are on the same plane;
  wherein the horizontal rotating shaft is connected with the top of the fixed base, such that the axial mutually-perpendicular bi-axial support is rotatable around the horizontal rotating shaft; and
  wherein the movable support is connected with the declinational rotating shaft by two middle connecting rods, such that the movable support rotates around the declinational rotating shaft and is suspended at the top of the fixed base.

5. The device for increasing the luminous flux per unit area according to claim 4, further comprises a sun-tracking part for making the main body of the device rotate with respect to the horizontal plane according to the direction of incident sun light so that the light receiving surface of the front lens part is perpendicular to the incident sun light.

6. The device for increasing the luminous flux per unit area according to claim 5, wherein said sun-tracking part comprises two groups of automatic tilt speed limiting parts of a horizontal automatic tilt speed limiting part and a declinational automatic tilt speed limiting part,
  wherein the horizontal automatic tilt speed limiting part comprises a horizontal tilt gravity generator, a horizontal damper for limiting tilt speed and a horizontal speed limiting fluted disk, and
  wherein the declinational automatic tilt speed limiting part comprises a declinational tilt gravity generator, a declinational damper for limiting tilt speed and a declinational speed limiting fluted disk.

7. The device for increasing the luminous flux per unit area according to claim 6, wherein said horizontal tilt gravity generator and declinational tilt gravity generator are fixed perpendicularly with each other at the bottom of the movable support;
  wherein the horizontal damper for limiting tilt speed is fixed on the fixed base,
  wherein the horizontal speed limiting fluted disk is fixed at one side of the axial mutually-perpendicular bi-axial support,
  wherein the horizontal damper for limiting tilt speed comprises a driven gear of main driver, a centrifuge rotor and a conical overspeed-preventer cover,
  wherein the driven gear of main driver of the horizontal damper for limiting tilt speed engages with the horizontal speed limiting fluted disk;
  wherein the declinational damper for limiting tilt speed is fixed on the movable support,
  wherein the declinational speed limiting fluted disk is fixed at one side of the axial mutually-perpendicular bi-axial support adjacent to the horizontal speed limiting fluted disk,
  wherein the declinational damper for limiting tilt speed comprises a driven gear of main driver, a centrifuge rotor and a conical overspeed-preventer cover,
  wherein a one-way bearing is disposed on the driven gear of main driver,
  wherein the outer ring of the centrifuge rotor are clutch disks connected by elastic reeds; and
  wherein the driven gear of main driver of the declinational damper for limiting tilt speed engages with the declinational speed limiting fluted disk.

8. The device for increasing the luminous flux per unit area according to claim 4, further comprising movable chutes disposed at the bottom of the support,
  wherein the photoelectric conversion array is connected with the support by the movable chutes, and
  wherein the photoelectric conversion array gets into or out of the projection area of the excident light of lens array group by the movable chutes.

* * * * *